United States Patent [19]

Yagi et al.

[11] Patent Number: 5,068,870
[45] Date of Patent: Nov. 26, 1991

[54] SEMICONDUCTOR LIGHT EMISSION SYSTEM

[75] Inventors: Tetsuya Yagi; Misao Hironaka, both of Hyogo, Japan

[73] Assignee: Mitsubishi Denki Kabushiki Kaisha, Tokyo, Japan

[21] Appl. No.: 612,943

[22] Filed: Nov. 13, 1990

Related U.S. Application Data

[63] Continuation of Ser. No. 97,457, Sep. 16, 1987.

[30] Foreign Application Priority Data

Sep. 17, 1986 [JP] Japan ................. 61-220244

[51] Int. Cl.$^5$ ........................... H01S 3/19
[52] U.S. Cl. ..................... 372/50; 357/17; 357/34; 357/40
[58] Field of Search ............. 372/50; 357/17, 34, 357/41, 40

[56] References Cited

U.S. PATENT DOCUMENTS

| 4,388,633 | 6/1983 | Vasuder ................. 372/50 |
| 4,513,423 | 4/1985 | Katz et al. ................. 372/50 |
| 4,521,888 | 6/1985 | Hayashi et al. .......... 372/50 |
| 4,748,633 | 5/1988 | Negishi ................. 372/38 |

FOREIGN PATENT DOCUMENTS 0042982  3/1986  Japan ................. 372/50

OTHER PUBLICATIONS

J. Katz "A Monolithic Integration of GaAs/GaAlAs Bipolar Transistor and Heterostructure Laser," Appl./Phys. Lett. 37(2), Jul. 15, 1980, pp. 211–213.

Primary Examiner—Georgia Epps
Attorney, Agent, or Firm—Dykema Gossett

[57] ABSTRACT

A semiconductor light emission system, comprising a semiconductor laser part constituted of a second conductive current restricting layer with a striped groove perforated therein, a first conductive clad layer, a first or second conductive active layer, a second conductive clad layer on a first conductive substrate, and a second conductive - first conductive - second conductive bipolar transistor part constituted of said second conductive current restricting layer, first conductive clad layer, first or second conductive active layer, second conductive active layer in a position other than the semiconductor laser part.

5 Claims, 4 Drawing Sheets

1 : p-GaAs substrate
2 : p-AℓGaAs buffer
3 : n-GaAs block layer
4 : p-AℓGaAs lower clad layer
5 : undoped AℓGaAs active layer
6 : n-AℓGaAs upper clad layer
7 : n-GaAs contact 8 : p side electrode
9 : n side electrode
10 : n-block layer electrode
11 : p-clad layer electrode
12 : semiconductor laser part
13 : bipolar transistor part
14,15 : current paths

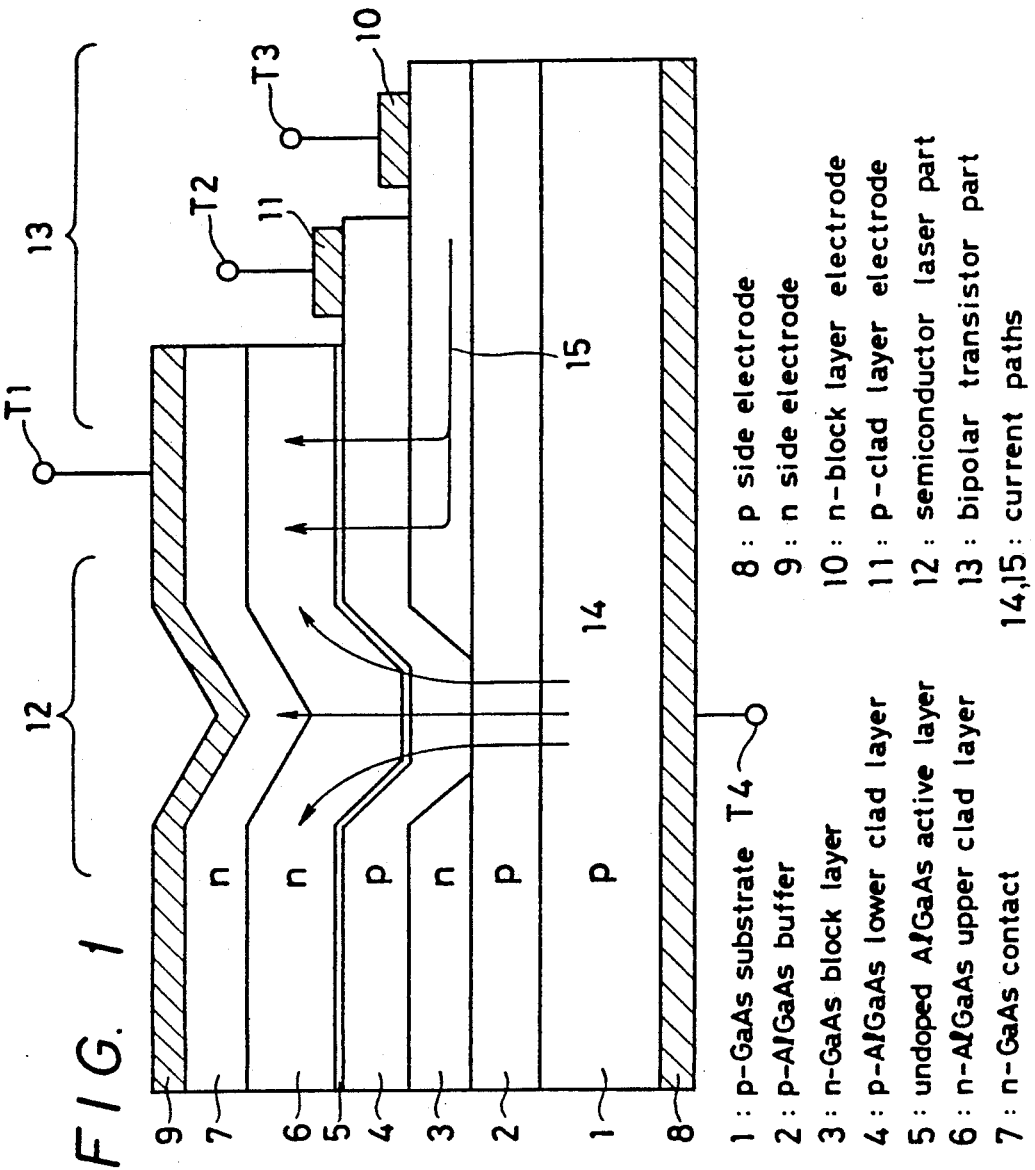

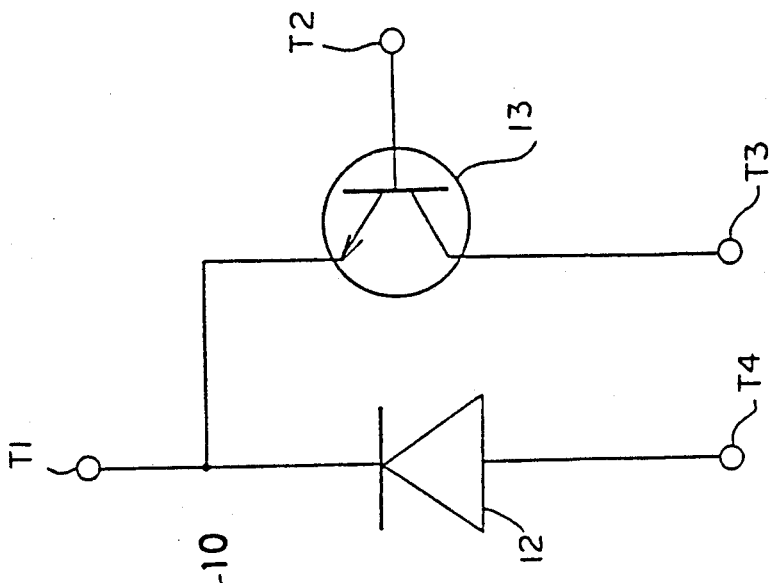
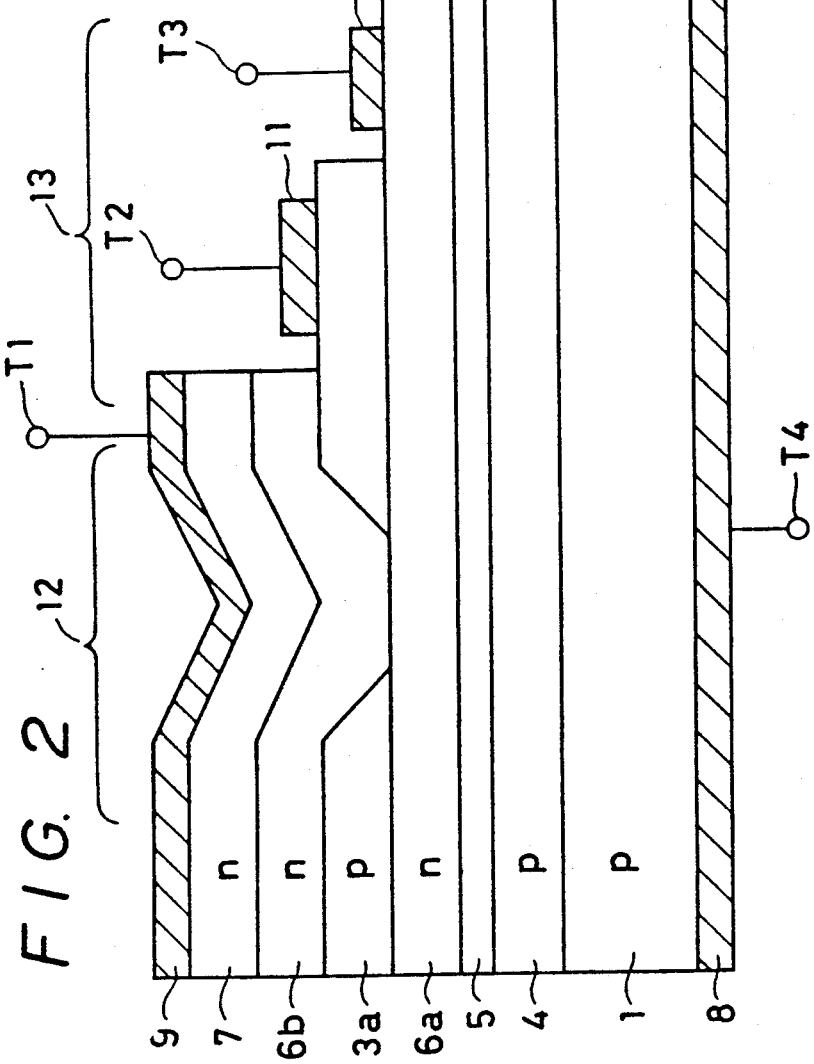
3a: p-GaAs block layer
6a: first n-AlGaAs upper clad layer
6b: second n-AlGaAs upper clad layer

SEMICONDUCTOR LIGHT EMISSION SYSTEM

This a continuation of copending application(s) Ser. No. 07/097,457 filed on 9/16/87.

BACKGROUND OF THE INVENTION

1. Field of the Invention

The present invention relates to a semiconductor light emission system, and is particularly concerned with a semiconductor laser capable of controlling a radiant power on a small current.

2. Description of the Prior Art

FIG. 7 is a characteristic curve representing one example of current vs. radiant power characteristic according to a conventional semiconductor light emission system, and FIG. 8 is a sectional perspective diagram representing a prior art semiconductor light emission system mentioned, for example, in Japanese Patent Laid-Open No. 192380/1985.

In FIG. 7, the quadrature axis indicates an operating current, and the axis of ordinate indicates a radiant power.

In FIG. 8, (1) denotes a first conductive (p-type or hereinafter referred to as "p-") GaAs substrate, (2) denotes a p-$Al_{0.45}Ga_{0.55}As$ buffer layer, (3) denotes a second conductive (n-type or hereinafter referred to as "n-") GaAs current block layer which is a current restricting layer with a striped groove provided on the p-GaAs substrate (1), (4) denotes a p-$Al_{0.45}Ga_{0.55}As$ lower clad layer, (5) denotes a p-type or n-type $Al_{0.15}Ga_{0.85}As$ active layer, (6) denotes an n-$Al_{0.45}Ga_{0.55}As$ upper clad layer, (7) denotes an n-GaAs contact layer, (8) denotes a p side electrode, and (9) denotes an n side electrode.

A function of the prior art semiconductor light emission system will be described with reference to FIG. 7 and FIG. 8.

When a positive voltage is impressed on the p side electrode (8) and a negative voltage on the n side electrode (9), a junction between the n-GaAs block layer (3) and the p-$Al_{0.45}Ga_{0.55}As$ lower clad layer (4) becomes inverted of bias in a domain where the n-GaAs block layer (3) is present between the electrodes (8), (9), therefore a current does not flow therein, and the current flows in concentration only on the opening of a striped groove (5a) or thereabout. In this case, a hole is injected into a portion near a bottom of the striped groove (5a) of the $Al_{0.15}Ga_{0.85}As$ active layer (5) from the p-$Al_{0.45}Ga_{0.55}As$ lower clad layer (4), an electron is injected then from the n-$Al_{0.45}Ga_{0.55}As$ upper clad layer (6), and thus a light is emitted through a recombination of both the two. According as a current level to be injected is further raised, an inductive emission begins presently, as shown in the characteristic curve of FIG. 7, to lead to a laser oscillation. A threshold current for laser oscillation will be 20 to 30 mA in the case of the semiconductor light emission system of FIG. 8, and an operating current for obtaining a 3 mW radiant power is required at 40 mA or so.

The prior art semiconductor light emission system has the above-described construction, and hence when a radiant power is to be controlled, a laser driving current must be controlled direct, and since the driving current is large to run from several tens mA to several hundreds mA, the problem is that a control circuit becomes inevitably complicated. Additional prior art is disclosed in the article entitled: "A Novel Self-Aligned Laser with Small Astigmatism Grown by MO-CVD" by Y. Mihashi, Y. Nagai, H. Matsubara and K. Ikeda, which is shown on extended abstract of the 17th Conference on Solid State Devices and Materials, Tokyo, pp. 63–66.

SUMMARY OF THE INVENTION

The invention has been done in view of the circumstances mentioned above, and its object is to provide a semiconductor light emission system capable of controlling a radiant power on a small current.

In order to attain the aforementioned object, the invention comprises providing a semiconductor laser part constituted of a second conductive current restricting layer with a striped groove perforated therein, a first conductive clad layer, a first or second conductive active layer, a second conductive clad layer on a first conductive substrate, and a second conductive-first conductive-second conductive or first conductive-second conductive-first conductive bipolar transistor part in a position other than the semiconductor laser part.

The invention further comprises providing a semiconductor laser part constituted of a first conductive clad layer, a first or second conductive active layer, a second conductive first clad layer, a first conductive current restricting layer with a striped groove perforated therein, a second conductive second clad layer on a first conductive substrate, and a first conductive-second conductive-first conductive or second conductive-first conductive-second conductive bipolar transistor part constituted in a position other than the semiconductor laser part.

In the bipolar transistor part according to the invention, an emitter current is controlled by the current injected into a base, a current injected into the semiconductor laser part is controlled consequently, and thus a radiant power is controlled thereby.

BRIEF DESCRIPTION OF THE DRAWINGS

FIG. 1 is a side sectional view representing preferred embodiments (A) and (B) of a semiconductor light emission system according to the invention;

FIG. 2 is a side sectional view representing embodiments (C) and (D) of the semiconductor light emission system of the invention;

FIG. 3 is a circuit diagram showing a simplified equivalent circuit of the embodiment (A) of FIG. 1 or the embodiment (D) of FIG. 2;

DETAILED DESCRIPTION OF PREFERRED EMBODIMENTS

Embodiments (A) to (D) of the invention will now be described with reference to the accompanying drawings.

Figure 4:
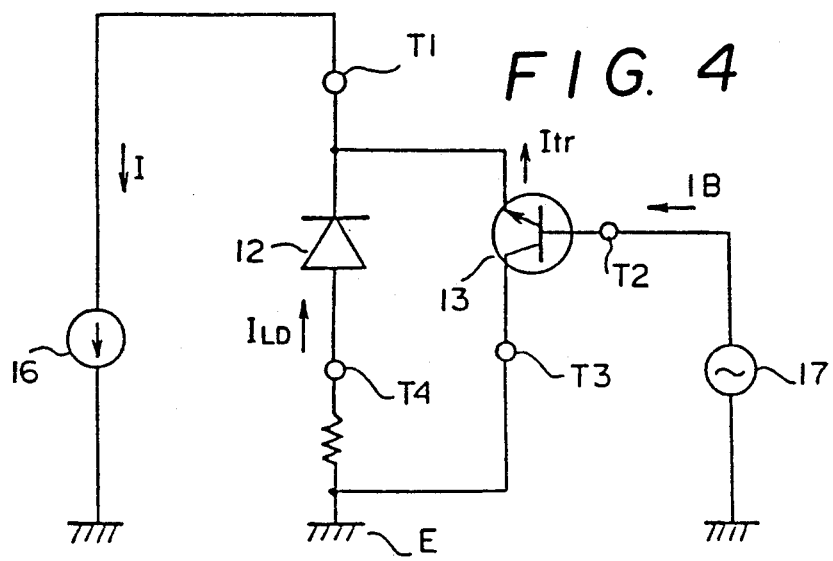
FIG. 4 is a circuit diagram showing a semiconductor light emission system driving circuit when the system of FIG. 3 is used.
Figure 5:
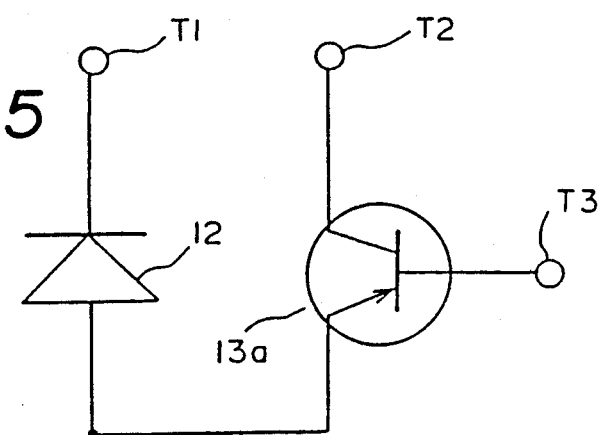
FIG. 5 is a circuit diagram showing a simplified equivalent circuit of the embodiment (B) of FIG. 1 or the embodiment (C) of FIG. 2.
Figure 6:
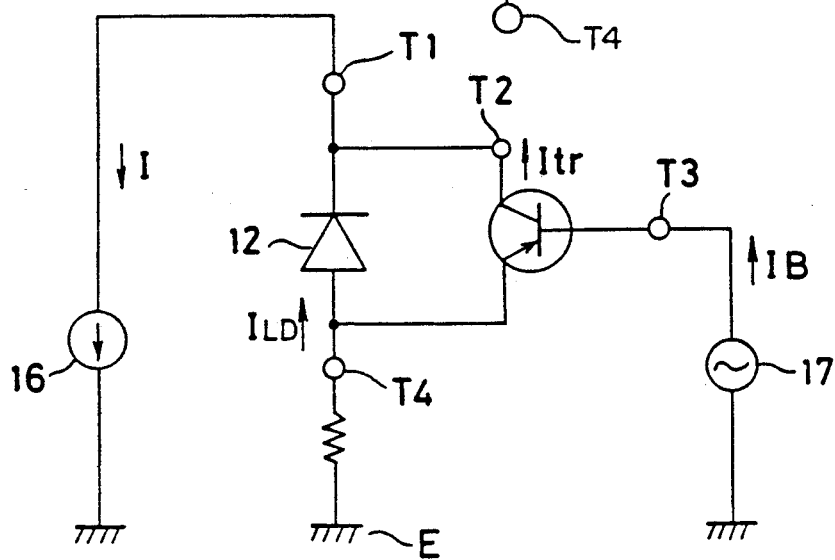
FIG. 6 is a circuit diagram showing a semiconductor light emission system driving circuit when the system of FIG. 5 is used.

FIG. 1 to FIG. 6 are drawings representing the embodiments of the invention, wherein FIG. 1 is a side sectional view representing the embodiments (A) and (B) of a semiconductor light emission system, FIG. 2 is a side sectional view representing the embodiments (C) and (D) of the semiconductor light emission system, FIG. 3 is a circuit diagram showing a simplified equivalent circuit of the embodiment (A) of FIG. 1 or the embodiment (D) of FIG. 2, FIG. 4 is a circuit diagram showing a semiconductor light emission system driving circuit when the system of FIG. 3 is used, FIG. 5 is a circuit diagram showing a simplified equivalent circuit of the embodiment (B) of FIG. 1 or the embodiment (C) of FIG. 2, and FIG. 6 is a circuit diagram showing a semiconductor light emission system driving circuit when the system of FIG. 5 is used.

In FIG. 1, (10) denotes an n-block layer electrode connected to the n-GaAs block layer (3) working as a current restricting layer, (11) denotes a p-clad layer electrode connected to the p-AlGaAs lower clad layer (4), (12) denotes a semiconductor laser part comprising the p-GaAs substrate (1), the p-AlGaAs buffer layer (2), the n-GaAs block layer (3) working as a current restricting layer, the p-AlGaAs lower clad layer (4), the p- or n-type undoped AlGaAs active layer (5), the n-AlGaAs upper clad layer (6), and the n-GaAs contact layer (7), (13) denotes a bipolar transistor part described hereinlater, (14) denotes a current path flowing into the semiconductor laser part (12) which will be described hereinlater, (15) denotes a current path flowing into the bipolar transistor part (13) which will be described hereinlater, ($T_1$) denotes a terminal connected with the n side electrode (9), ($T_2$) denotes a terminal of the p-clad layer electrode (11), ($T_3$) denotes a terminal of the n-block layer electrode (10), and ($T_4$) denotes a terminal connected with the p side electrode (8).

In FIG. 1, like reference characters represent like or corresponding components in the aforementioned example, and hence a repeated description will be omitted.

In FIG. 2, (3a) denotes a p-GaAs block layer working as a current restricting layer with a striped groove provided thereon, (6a) denotes a first n-AlGaAs upper clad layer as a first clad layer, (6b) denotes a second n-AlGaAs upper clad layer as a second clad layer, (12) denotes a semiconductor laser part comprising the p-GaAs substrate (1), the p-AlGaAs lower clad layer (4), the p- or n-type undoped AlGaAs active layer (5), the first n-AlGaAs upper clad layer (6a), the p-GaAs block layer (3a) as a current strictured layer, the second n-AlGaAs clad layer (6b), and the n-GaAs contact layer (7), and (13) denotes a bipolar transistor part constructed as described hereinlater.

Then, in FIG. 1, the n-GaAs block layer (3) is formed between the undoped AlGaAs active layer (5) and the p-GaAs subtrate (1), however, FIG. 2 indicates the construction wherein the p-GaAs block layer (3a) is present on the first n-AlGaAs upper clad layer (6a).

In FIG. 2 to FIG. 6, like reference characters represent like or corresponding components in FIG. 1, and hence a repeated description will be omitted.

Next, the embodiments (A) to (D) will be described each with reference to FIG. 1 to FIG. 6.

In the first place, the embodiment (A) will be taken up for description with reference to FIG. 1, FIG. 3 and FIG. 4.

Figure 8:
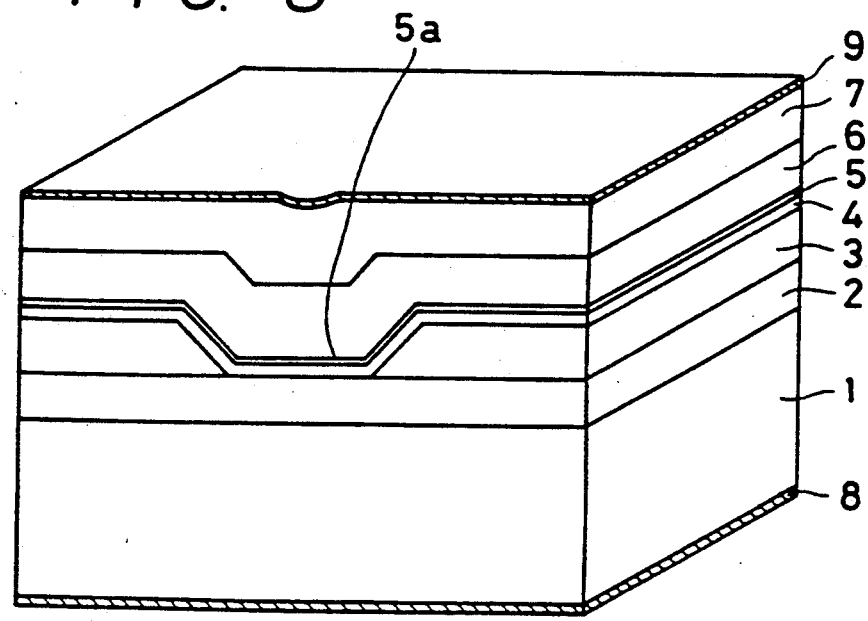
FIG. 8 is a sectional perspective view showing an example of the prior art semiconductor light emission system.

The embodiment (A) comprises the semiconductor laser part (12) and the bipolar transistor part (13) of FIG. 1, the semiconductor laser part (12) being the same in construction as the semiconductor light emission system in FIG. 8, and hence the repeated description will be omitted here. The bipolar transistor part (13) comprises the undoped AlGaAs active layer (5), the n-AlGaAs upper clad layer (6), the n-GaAs contact layer (7) which is an emitter of the bipolar transistor part (13), the n side electrode (9) which is an emitter electrode of the transistor, the p-AlGaAs lower clad layer (4) which is a base of the transistor, the p-clad electrode (11) which is a base electrode of the transistor, the n-GaAs block layer (3) which is a collector of the transistor, and the n-block electrode (10) which is a collector electrode of the transistor, thus constituting the bipolar npn transistor (13).

Next, an operation of the embodiment (A) will be described according to the drawing.

An operation of each of the layers (1) to (7) of the semiconductor laser part (12) is equivalent to the above-described example, therefore the description will be omitted.

The bipolar transistor part (13) operates as an npn bipolar transistor of the emitter, the emitter electrode, the base, the base electrode, the collector, and the collector electrode.

The operation will further be described with reference to the circuit diagrams of FIG. 3 and FIG. 4.

As described above, an emitter corresponding domain in the bipolar transistor part (13) is common to the n-GaAs contact layer (7) and the n-AlGaAs upper clad layer (6) of the semiconductor laser part (12), therefore a simplified equivalent circuit of the embodiment (A) will be as shown in FIG. 3, and the system of FIG. 3 will be realized as shown in FIG. 4 when connected through a circuit configuration.

In the circuit of FIG. 4, a steady-state current (I) by a constant current source (16) flows between the terminal ($T_1$) and an earth (E).

Further, a controlling current (IB) by an alternating current signal source (17) is injected in the p-AlGaAs lower clad layer (4) at a portion corresponding to the base of the bipolar transistor part (13).

In the circuit configuration of FIG. 4, the bipolar transistor part (13) is a common-collector transistor circuit, and a current $I_{tr}$ flowing from the collector to the emitter can be controlled by a small change of the base current (IB).

The current $I_{tr}$ corresponds to a current, in FIG. 1, injected from the n-block layer electrode (10) and flowing out to an external circuit by way of the n-block layer (3), the p-lower clad layer (4), the active layer (5), the n-upper clad layer (6), the n-contact layer (7) and the n side electrode (9).

The current path is indicated by the path (15) of FIG. 1.

In the circuit shown in FIG. 4, a gross current (I) flowing to the semiconductor laser part (12) or the system according to the invention and to the bipolar transistor part (13) is constant, and the current (I) is expressed by the sum of a current ($I_{LD}$) flowing to the semiconductor laser part (12) and a current ($I_{tr}$) flowing out of the emitter of the bipolar transistor part (13).

Accordingly, the current ($I_{LD}$) flowing to the semiconductor laser part (12) (or the current flowing through the path (14) of FIG. 1) will be:

$$I_{LD} = I - I_{tr} = I - f(IB), \ldots \quad (1)$$

Figure 7:
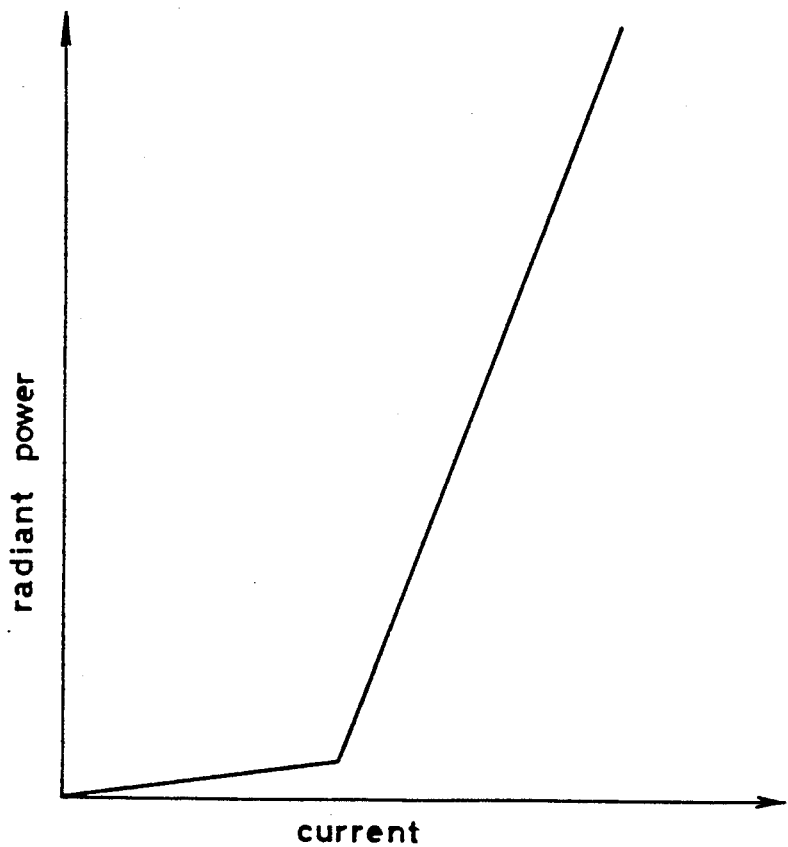
FIG. 7 is a characteristic curve representing one example of current vs. radiant power characteristic according to a conventional semiconductor light emission system.

Here, f(IB) represents a function of the current (IB). Generally, an operating current of the laser and a radiant power are correlated as indicated in FIG. 7, and when the current exceeds a threshold necessary for oscillation, a relation between the radiant power and the current becomes almost linear.

Accordingly, the radiant power can be controlled by the small current (IB) injected from the p-clad layer electrode (11) corresponding to a base electrode from the aforementioned expression (1) in the system.

The embodiment (B) will be described next with reference to FIG. 1, FIG. 5 and FIG. 6.

The embodiment (B) comprises the semiconductor laser part (12) and the bipolar transistor part (13) of FIG. 1, of which the semiconductor laser part (12) is the same in construction as the embodiment (A) described above, and the description will be omitted consequently. In FIG. 1, the bipolar transistor part (13) constitutes a pnp bipolar transistor with the p-AlGaAs lower clad (4) as a p-collector, the n-GaAs block layer (3) as an n-base, the p-AlGaAs buffer layer (2) and the p-GaAs substrate (1) as a p-emitter.

In this case, a film thickness of each layer varies from the above-described embodiment (A).

As mentioned hereinbefore, the p-emitter corresponding domain of the bipolar transistor (13) is common to the p-AlGaAs buffer layer (2) and the p-GaAs substrate (1) of the semiconductor laser part (12), therefore a simplified equivalent circuit of the embodiment (B) will be as shown in FIG. 5.

A semiconductor light emission system driving circuit when the embodiment (B) shown in the circuit diagram of FIG. 5 is used is shown in FIG. 6.

An operation in this case may apply correspondingly to the embodiment (A) described hereinabove, therefore a repeated description will be omitted.

In the embodiment (B), the radiant power can also be controlled by a small current injected from the n-block layer electrode (10) corresponding to a base electrode as in the case of embodiment (A).

The embodiment (C) will be described next with reference to FIG. 2, FIG. 5 and FIG. 6.

The embodiment (C) comprises the semiconductor laser part (12) and the bipolar transistor part (13) of FIG. 2, of which the semiconductor laser part (12) is constituted, as described in FIG. 2, of the p-GaAs substrate (1), the p-AlGaAs lower clad layer (4), the AlGaAs active layer (5), the first n-AlGaAs upper clad layer (6a), the p-GaAs block layer (3a), the second n-AlGaAs upper clad layer (6b), the n-GaAs contact layer (7), and the bipolar transistor part (13) is constituted as a pnp bipolar transistor comprising the p-GaAs substrate (1), the p-AlGaAs lower clad layer (4), the undoped AlGaAs active layer (5), the first n-AlGaAs upper clad layer (6a) and the p-GaAs block layer (3a).

A simplified equivalent circuit of the embodiment (C) is equivalent to FIG. 5, and the semiconductor light emission system driving circuit is equivalent to FIG. 6.

Since an operation of the embodiment (C) applies correspondingly to the above-described embodiment (A), no further description will be given repeatedly thereon.

In the embodiment (C), the radiant power can be controlled also by a small current injected from the first n-upper clad layer electrode (10) corresponding to a base electrode as in the case of embodiment (A).

Next, the embodiment (D) will be described with reference to FIG. 2, FIG. 3 and FIG. 4.

The embodiment (D) comprises the semiconductor laser part (12) and the bipolar transistor part (13) of FIG. 2, of which the semiconductor laser part (12) is similar to the semiconductor laser part (12) of the above-described embodiment (C), therefore the description will be omitted. The bipolar transistor part (13) is constituted as an npn bipolar transistor comprising the first n-AlGaAs upper clad layer (6a), the p-GaAs block layer (3a), the second n-AlGaAs upper clad layer (6b) and the n-GaAs contact layer (7).

A simplified equivalent circuit of the embodiment (D) is equivalent to FIG. 3, and the semiconductor light emission system driving circuit is similar to FIG. 4.

An operation of the embodiment (D) applies correspondingly to the embodiment (A) described hereinabove, therefore a repeated description will be omitted.

In the embodiment (D), the radiant power can also be controlled by a small current injected from the p-block layer electrode (11) corresponding to a base electrode as in the case of embodiment (A).

Further, the embodiments (A) to (D) indicate the case where each semiconductor is formed of an AlGaAs group material, however, a similar effect will also be obtainable from forming of an InGaAs group material.

Then, each of the aforementioned embodiments has been described with the first conductive type as p-type and the second conductive type as n-type, however, a similar operating effect will be obtainable in a similar construction from taking the first conductive type as n-type and the second conductive type as p-type.

As described above, the invention comprises forming the bipolar transistor part of a current restricting layer, a clad layer and an active layer in addition to the semiconductor laser part, therefore a current flowing to the semiconductor laser part can be controlled by the current injected into a base of the bipolar transistor part, thus ensuring an effect in controlling a radiant power on a small current.

What is claimed is:

1. In a semiconductor light emission system having a semiconductor laser part including a current block layer, a first conductive clad layer, a conductive active layer, a second conductive clad layer on a conductive substrate, and a bi-polar transistor part having a collector, an emitter and a base in a position other than said semiconductor laser part, wherein the intensity of said laser part is controlled by controlling the current injected into the base.

2. A semiconductor device integrating a semiconductor laser and a transistor, said semiconductor device comprising:

(a) a plurality of layers of semiconductive material, said plurality of layers having a first region for supporting lasing and a second region, spaced from said first region, said second region including means for diverting the flow of an electric current around said first region.

3. The semiconductor device of claim 2, wherein said second region comprises a bi-polar transistor having a base, emitter and collector, and wherein said transistor is adapted to divert said electric current away from said first region as a function of the magnitude of an electric current passed through said transistor base.

4. In an integrated semiconductor light emission system, comprising:
   (a) a semiconductor laser portion, and
   (b) a bi-polar transistor portion, said semiconductor laser portion including a current block layer, a first conductive clad layer, a conductive active layer, a second conductive clad layer on a conductive substrate, a base, emitter and collector, and wherein at least two of said layers are continuous across said portions and comprises said emitter and base of said transistor portion.

5. In an integrated semiconductor light emission system, comprising:
   (a) a semiconductor laser portion, and
   (b) a bi-polar transistor portion, said semiconductor laser portion including a current block layer, a first conductive clad layer, a conductive active layer, a second conductive clad layer on a conductive substrate, a base, emitter and collector, and wherein at least two of said layers are continuous across said portions and comprises said emitter and collector of said transistor portion.

* * * * *